(12) United States Patent
Pawlak et al.

(10) Patent No.: US 8,716,156 B1
(45) Date of Patent: May 6, 2014

(54) METHODS OF FORMING FINS FOR A FINFET SEMICONDUCTOR DEVICE USING A MANDREL OXIDATION PROCESS

(71) Applicant: GlobalFoundries Inc., Grand Cayman (KY)

(72) Inventors: Bartlomiej Jan Pawlak, Leuven (BE); Steven Bentley, Watervliet, NY (US); Ajey Jacob, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/757,069

(22) Filed: Feb. 1, 2013

(51) Int. Cl.
*H01L 21/31* (2006.01)

(52) U.S. Cl.
USPC ............ 438/792; 438/770; 438/776; 438/778

(58) Field of Classification Search
CPC ............ H01L 27/0886; H01L 27/0924; H01L 27/10826; H01L 27/10879; H01L 29/41791; H01L 29/66795
See application file for complete search history.

(56) References Cited

U.S. PATENT DOCUMENTS

| | | | |
|---|---|---|---|
| 6,967,351 B2 | 11/2005 | Fried et al. | |
| 6,989,308 B2 | 1/2006 | Furukawa et al. | |
| 2003/0193058 A1 | 10/2003 | Fried et al. | |
| 2005/0121676 A1 | 6/2005 | Fried et al. | |
| 2006/0022253 A1 | 2/2006 | Anderson et al. | |
| 2006/0038216 A1 | 2/2006 | Fried et al. | |
| 2006/0240610 A1 | 10/2006 | Nowak et al. | |
| 2008/0042219 A1 | 2/2008 | Booth, Jr. et al. | |
| 2008/0142891 A1 | 6/2008 | Booth et al. | |
| 2009/0001470 A1 | 1/2009 | Anderson et al. | |
| 2009/0075439 A1 | 3/2009 | Furukawa et al. | |
| 2009/0124097 A1* | 5/2009 | Cheng ........................ | 438/792 |
| 2011/0045648 A1 | 2/2011 | Knorr et al. | |
| 2011/0053361 A1 | 3/2011 | Muralidhar et al. | |
| 2012/0043597 A1 | 2/2012 | Chen et al. | |

* cited by examiner

*Primary Examiner* — Kyoung Lee
(74) *Attorney, Agent, or Firm* — Amerson Law Firm, PLLC

(57) ABSTRACT

One illustrative method disclosed herein includes forming a mandrel structure above a semiconductor substrate, performing an oxidation process to oxidize at least a portion of the mandrel structure so as to thereby define oxidized regions on the mandrel structure, removing the oxidized regions to thereby defined a reduced thickness mandrel structure, forming a plurality of fins on the reduced thickness mandrel structure and performing an etching process to selectively remove at least a portion of the reduced thickness mandrel structure so as to thereby expose at least a portion of each of the fins.

39 Claims, 6 Drawing Sheets

(View X-X)

(View X-X)

(View X-X)

(View X-X)

(View X-X)

(View X-X)

(View X-X)

(View X-X)

(View X-X)

(View X-X)

(View X-X)

(View X-X)

METHODS OF FORMING FINS FOR A FINFET SEMICONDUCTOR DEVICE USING A MANDREL OXIDATION PROCESS

BACKGROUND OF THE INVENTION

1. Field of the Invention

Generally, the present disclosure relates to the manufacture of FET semiconductor devices, and, more specifically, to various methods of forming a FinFET semiconductor device using a novel mandrel oxidation process to form the fins for the device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins, and these trenches may be formed in the substrate during the same process operation for processing simplicity. In some cases, the trenches are desirably designed with the same pitch (for better resolution during lithography) and they are formed to the same depth and width (for processing simplicity and various functional requirements), wherein the depth of the trenches is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices which are intended to enhance the performance capabilities of such devices, e.g., to enable low-voltage operation. However, the integration of such alternative materials on silicon substrates (the dominant substrates used in the industry) is a non-trivial matter due to, among other issues, the large difference in lattice constants between such materials and silicon.

The present disclosure is directed to various methods of forming a FinFET semiconductor device using a novel mandrel oxidation process to form the fins for the device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a FinFET semiconductor device using a novel mandrel oxidation process to form the fins for the device. One illustrative method disclosed herein includes forming a mandrel structure having sidewalls, performing an oxidation process to oxidize at least a portion of the mandrel structure to thereby define oxidized regions on the sidewalls of the mandrel structure, removing the oxidized regions to thereby define a reduced thickness mandrel structure, forming a plurality of fins on the reduced thickness mandrel structure and performing an etching process to selectively remove at least a portion of the reduced thickness mandrel structure so as to thereby expose at least a portion of each of the fins.

Another illustrative method disclosed herein involves forming a fin mandrel structure above a semiconductor substrate, performing an oxidation process to oxidize at least a portion of the fin mandrel structure so as to thereby define oxidized regions on the fin mandrel structure, removing the oxidized regions to thereby defined a reduced thickness fin mandrel structure, forming a plurality of fins on the reduced thickness fin mandrel structure, performing an etching process to selectively remove at least a portion of the reduced thickness fin mandrel structure so as to thereby expose at least a portion of each of the fins and forming a final gate structure around the exposed portions of the fins.

Yet another illustrative method disclosed herein involves forming a fin mandrel structure comprised of a first semiconductor material above a semiconductor substrate comprised of a second semiconductor material that is different than the first semiconductor material, performing an oxidation process to oxidize at least a portion of the fin mandrel structure to thereby define oxidized semiconductor material regions on the fin mandrel structure, removing the oxidized semiconductor material regions to thereby define a reduced thickness fin mandrel structure, forming a plurality of fins on the reduced thickness fin mandrel structure, wherein the fins are comprised of an epitaxially grown semiconductor material, performing an etching process to selectively remove at least a portion of the reduced thickness fin mandrel structure so as to thereby expose at least a portion of the fins and forming a final gate structure around at least a portion of the fins.

BRIEF DESCRIPTION OF THE DRAWINGS

The disclosure may be understood by reference to the following description taken in conjunction with the accompanying drawings, in which like reference numerals identify like elements, and in which.

Figure 1A:
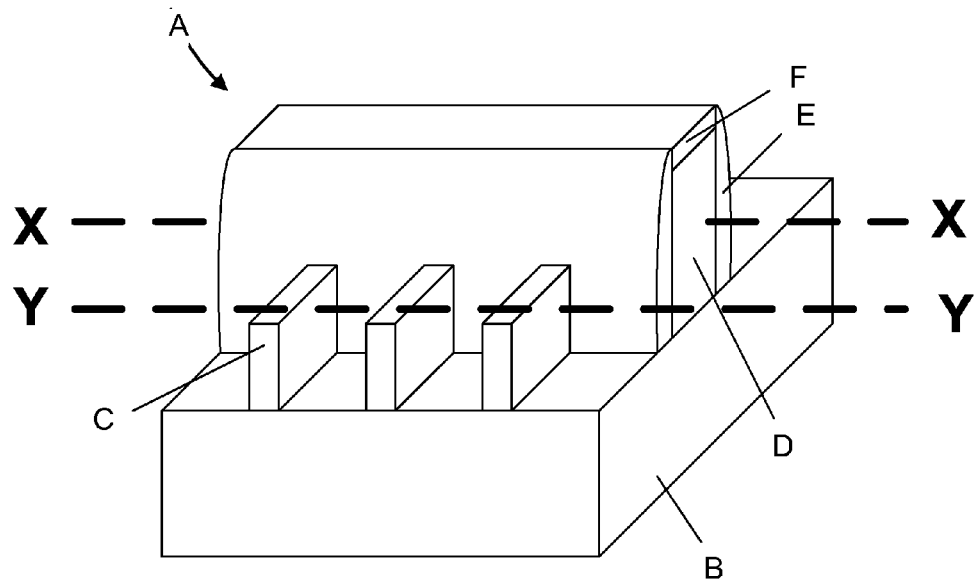
FIGS. 1A-1L depict various illustrative methods disclosed herein for forming a FinFET semiconductor device using a novel mandrel oxidation process to form the fins for the device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a FinFET semiconductor device using a novel mandrel oxidation process to form the fins for the device. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIG. 1A is a perspective view of a reference FinFET semiconductor device A that is formed above a semiconductor substrate B. The device A includes a plurality of fins C, a gate electrode D, sidewall spacers E and a gate cap layer F. FIG. 1A depicts the locations where various cross-sectional views of the devices disclosed herein may be taken in the drawings discussed below. More specifically, view "X-X" is a cross-sectional view taken through the gate electrode D in a direction that is parallel to the long axis of the gate electrode D, i.e., in the gate width direction. The portions of the fins C covered by the gate electrode D are the channel regions of the FinFET device A. The view "Y-Y" is a cross-sectional view taken through the fins C in a direction that is transverse to the long axis of the fins C (outside the gate electrode D and the spacer E), i.e., through what will become the source/drain regions of the device. In a conventional process flow, the portions of the fins C that are positioned in the source/drain regions may be increased in size or even merged together (not shown in FIG.

1A) by performing one or more epitaxial growth processes. The process of increasing the size of or merging the fins C in the source/drain regions of the device is to reduce the resistance of source/drain regions or to induce tensile or compressive stress in the channel area. It should be understood that FIG. 1A is only provided to show the location of various cross-sectional views that may be depicted in the drawings below, and many aspects discussed below are not depicted in FIG. 1A so as to not overly complicate the device A depicted in FIG. 1A.

FIGS. 1B-1L depict various illustrative embodiments of a novel FinFET semiconductor device 100 disclosed herein, and various methods of making the FinFET device 100. The device 100 may be either an N-type device or a P-type device, and its gate structure may be formed using either so-called "gate-first" or "replacement gate" ("gate-last") techniques. In the attached drawings, the device 100 is depicted as being formed above a semiconductor substrate 10 comprised of a first semiconductor material, such as, for example, silicon, etc. The illustrative substrate 10 may be a bulk semiconductor substrate, or it may be the active layer of a so-called SOI (silicon-on-insulator) substrate or a so-called SGOI (silicon germanium on insulator) substrate. Thus, the terms "substrate," "semiconductor substrate" or "semiconducting substrate" should be understood to cover all semiconductor materials and all forms of such semiconductor materials. A trench isolation structure (not shown) may be formed in the substrate 10 to define an active region where the device 100 will be formed. Of course, as will be recognized by those skilled in the art after a complete reading of the present application, the isolation structure may be formed before or after various fins (described below) are formed for the device 100.

Figure 1B:
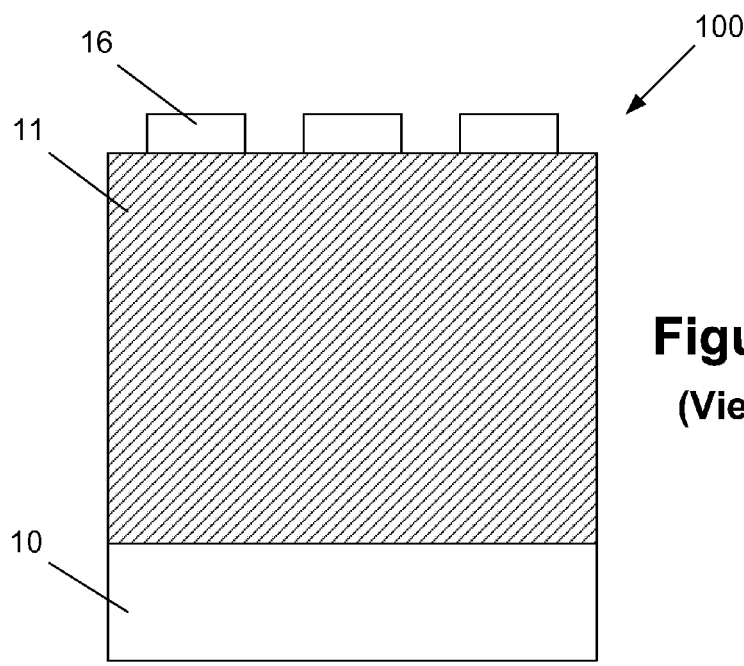

At the point of fabrication depicted in FIG. 1B, in one illustrative embodiment, a layer of semiconductor material 11 and a patterned masking layer 16 have been formed above the substrate 10. In one illustrative embodiment, the layer of semiconductor material 11 may be comprised of a semiconductor material that is different than the semiconductor material of the substrate 10. For example, in the case where the substrate 10 is silicon, the layer of semiconductor material 11 may be a layer of silicon germanium, germanium, InP, InAs, GaAs, etc., and it may be formed on the substrate 10 by performing an epitaxial growth process. In one illustrative embodiment, the layer of semiconductor material 11 may have a thickness of about 10-100 nm, although its thickness may vary depending upon the particular application.

The patterned masking layer 16 may be a patterned hard mask layer and it may be formed using known deposition, photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the layer of semiconductor material 11 and a silicon nitride layer (not shown) that is formed on the pad oxide layer. Thus, the particular form and composition of the patterned mask layer 16 and the manner in which it is made should not be considered a limitation of the presently disclosed inventions. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process to deposit a layer of silicon nitride and thereafter patterning the layer of silicon nitride using known sidewall image transfer techniques and/or photolithographic techniques combined with performing known etching techniques.

Figure 1C:
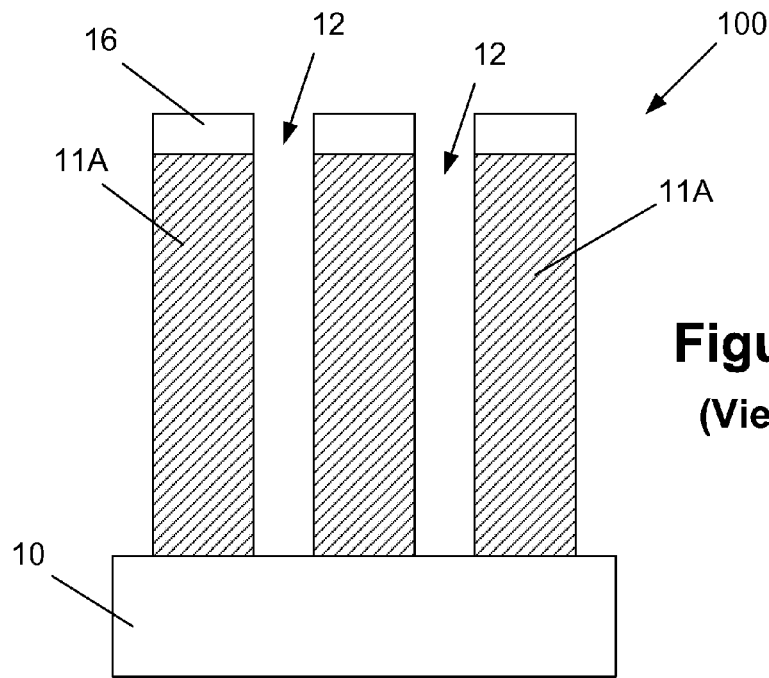

Next, as shown in FIG. 1C, one or more dry or wet etching processes is performed on the layer of semiconductor material 11 through the patterned mask layer 16 to form a plurality of trenches 12. In this example, the etching process stops on the substrate 10. This etching process results in the definition of a plurality of mandrel structures 11A, and, in this particular embodiment, fin mandrel structures, that are each comprised of a portion of the layer of semiconductor material 11. In the depicted example, the mandrel structures 11A have substantially vertically oriented sidewalls. The overall size, shape and configuration of the trenches 12 and the mandrel structures 11A may vary depending on the particular application. The depth and width of the trenches 12 as well as the height and width of the fin mandrel structures 11A may vary depending upon the particular application. In one illustrative embodiment, based on current day technology, the width of the trenches 12 may range from about 10-40 nm. In some embodiments, the fin mandrel structures 11A may have a width within the range of about 20-60 nm. The fin mandrel structures 11A may be formed to any desired pitch. In the illustrative example depicted in the attached figures, the trenches 12 and the fin mandrel structures 11A are all of a uniform size and shape. However, such uniformity in the size and shape of the trenches 12 and the fin mandrel structures 11A may not be required to practice at least some aspects of the inventions disclosed herein. In the example disclosed herein, the trenches 12 are depicted as having been formed by performing an anisotropic etching process that results in the trenches 12 having a schematically depicted, generally rectangular configuration with substantially vertical sidewalls. In an actual real-world device, the sidewalls of the trenches 12 may be somewhat inwardly tapered, although that configuration is not depicted in the drawings. In some cases, the trenches 12 may have a reentrant profile near the bottom of the trenches 12. To the extent the trenches 12 are formed by performing a wet etching process, the trenches 12 may tend to have a more rounded configuration or non-linear configuration as compared to the generally rectangular configuration of the trenches 12 that are formed by performing an anisotropic etching process. Thus, the size and configuration of the trenches 12, and the manner in which they are made, should not be considered a limitation of the present invention. For ease of disclosure, only the substantially rectangular trenches 12 will be depicted in subsequent drawings.

Figure 1D:
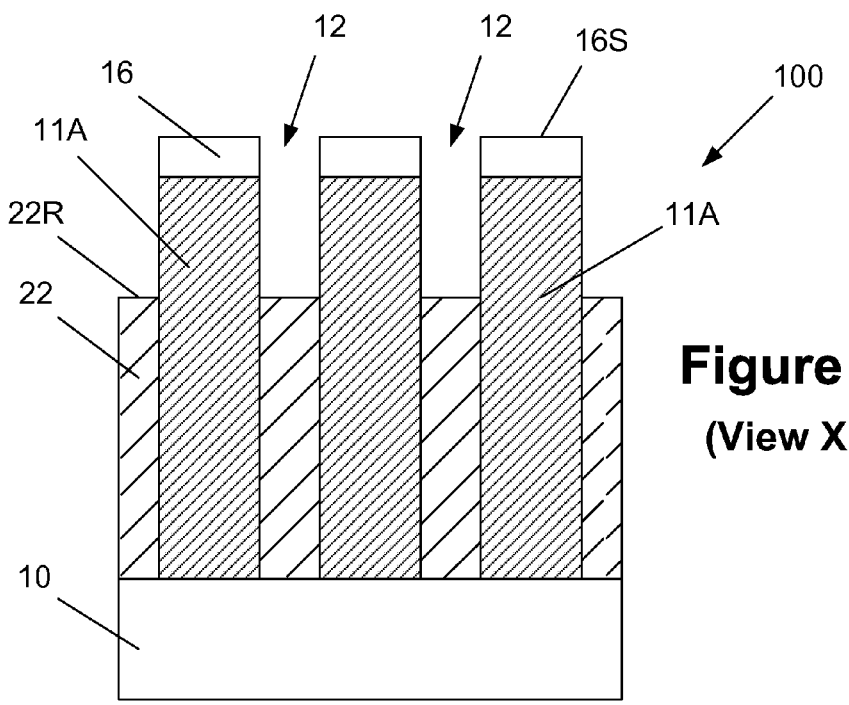

FIG. 1D depicts the device 100 after several process operations have been performed. First, a layer of insulating material 22 was formed on the device 100 so as to overfill the trenches 12. The layer of insulating material 22 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, etc. Next, one or more chemical mechanical polishing (CMP) processes was performed to planarize the upper surface of the layer of insulating material 22 using the patterned mask layer 16 as a polish-stop layer. After such a CMP process, the upper surface of the layer of insulating material 22 is substantially level with the upper surface 16S of the patterned mask layer 16. With continuing reference to FIG.

1D, an etching process was then performed on the planarized layer of insulating material 22 to reduce its thickness and thereby result in the layer of insulating material having a recessed upper surface 22R. The recessed surface 22R of the layer of insulating material 22 exposes a portion of the fin mandrel structures 11A for further processing. The amount or height of the fin mandrel structures 11A exposed in this process may vary depending upon the particular application and, in one illustrative embodiment, may range from about 30-50 nm.

Figure 1E:
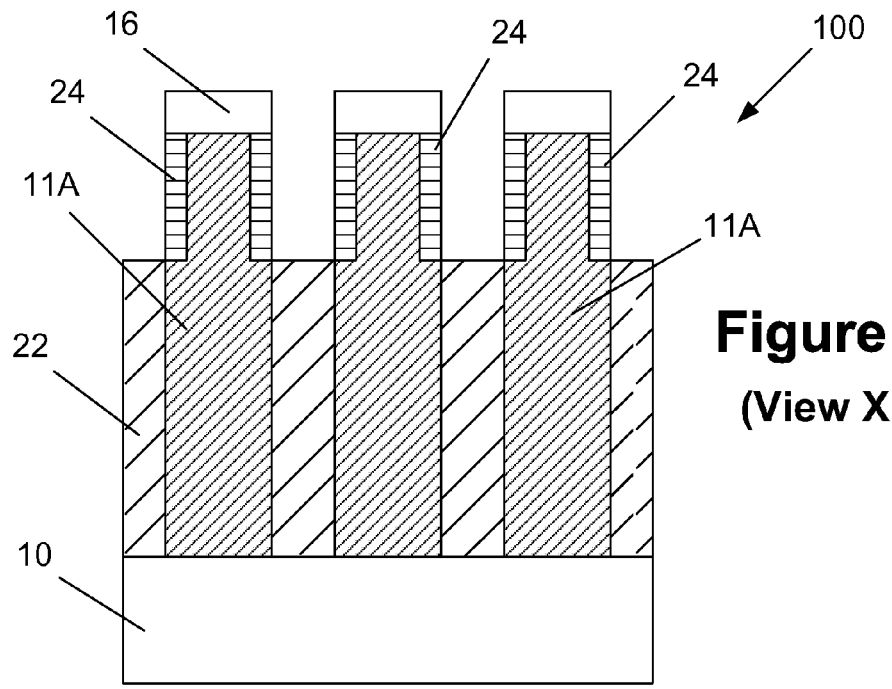

Then, as shown in FIG. 1E, an oxidation process is performed to form semiconductor based oxide regions 24 on the exposed portions of the fin mandrel structures 11A. In the case where the layer of semiconductor material 11 (FIG. 11) is comprised of germanium, the semiconductor based oxide regions 24 may be comprised of germanium oxide. In one illustrative embodiment, the semiconductor based oxide regions 24 may have a lateral thickness or width of about 4-12 nm, although the thickness of the semiconductor based oxide regions 24 may vary depending upon the particular application and the desired width of the final fin structures for the device 100, as described more fully below.

Figure 1F:
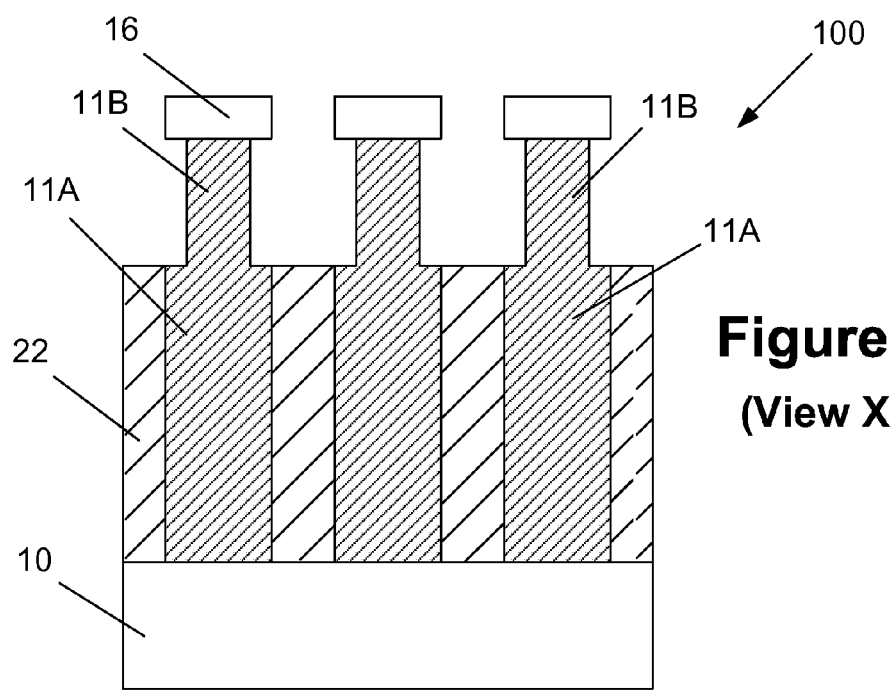

Next, as shown in FIG. 1F, an etching process, such as a wet etching process, is performed to remove the semiconductor based oxide regions 24. This process results in the formation of reduced thickness fin mandrel structures 11B, wherein the width or thickness of the exposed portions of the original fin mandrel structures 11A is reduced by an amount that corresponds approximately to twice the width or thickness of the semiconductor based oxide regions 24. The final thickness or lateral width of the reduced thickness fin mandrel structures 11B may vary depending upon the particular application, e.g., it may have a thickness on the order of about 10-40 nm depending upon the width or thickness of the original fin mandrel structures 11A and the width or thickness of the semiconductor based oxide regions 24.

Figure 1G:
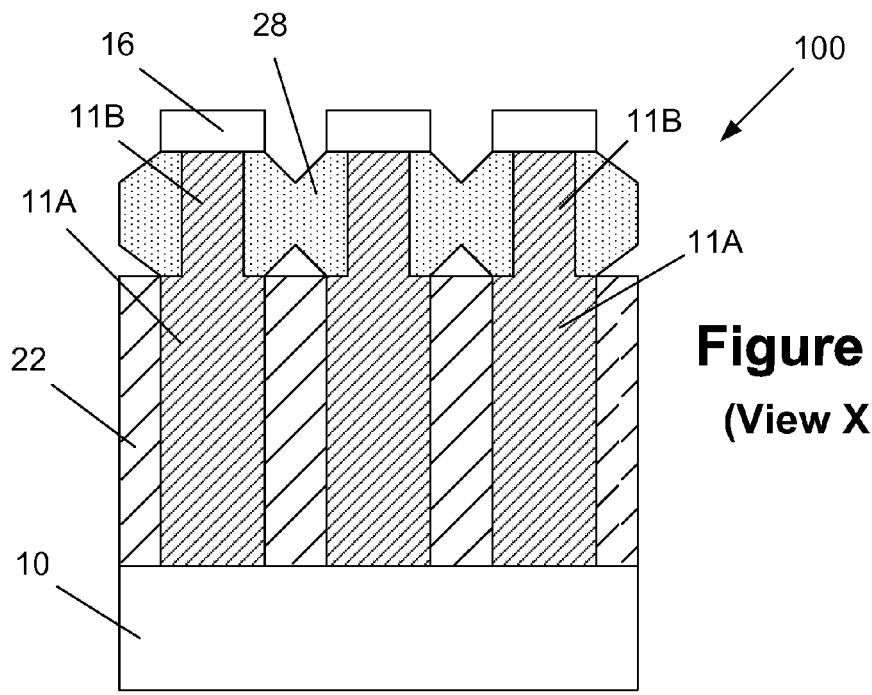

FIG. 1G depicts the device after a semiconductor material 28 has been epitaxially grown on the reduced thickness fin mandrel structures 11B. In general, the semiconductor material 28 may be comprised of a semiconductor material that may be selectively etched with respect to the material of the reduced thickness fin mandrel structures 11B. In one illustrative embodiment, the semiconductor material 28 may be a III-V material, InGaAs, GaAs, InAs, GaSb, InSbAs, etc. In some cases, the semiconductor material 28 may be made of a semiconductor material that is different from the semiconductor materials used for the substrate 10 and the layer of semiconductor material 11. The semiconductor material 28 may or may not be diamond-shaped or otherwise irregularly-shaped in nature, depending on the crystalline structure of the reduced thickness fin mandrel structures 11B. In one particular embodiment, sufficient semiconductor material 28 is grown such that the semiconductor material 28 actually merges together, in a similar or a slightly different way as depicted in the drawings. The extent and shape of the merging depends on the growth conditions and the relative growth kinetics of the various crystalline planes of the particular semiconductor material.

Next, as shown in Figure H, an anisotropic etching process is performed through the patterned mask layer 16 to remove portions of the semiconductor material 28 that are not protected by the patterned mask layer 16. This anisotropic etching process results in the definition of a plurality of semiconductor material spacers/fins 28A that will become the fins for the final FinFET device 100. Note that the fins 28A are positioned under portions of the patterned mask layer 16 after this etching process has been performed. As depicted, in one illustrative embodiment, the semiconductor material spacers/fins 28A have a lateral width or thickness that corresponds approximately to the lateral width or thickness of the semiconductor based oxide regions 24 (FIG. 1E).

FIG. 11 depicts the device 100 after one or more etching processes have been performed to selectively remove the patterned mask layer 16 relative to the surrounding structures.

Figure 1H:
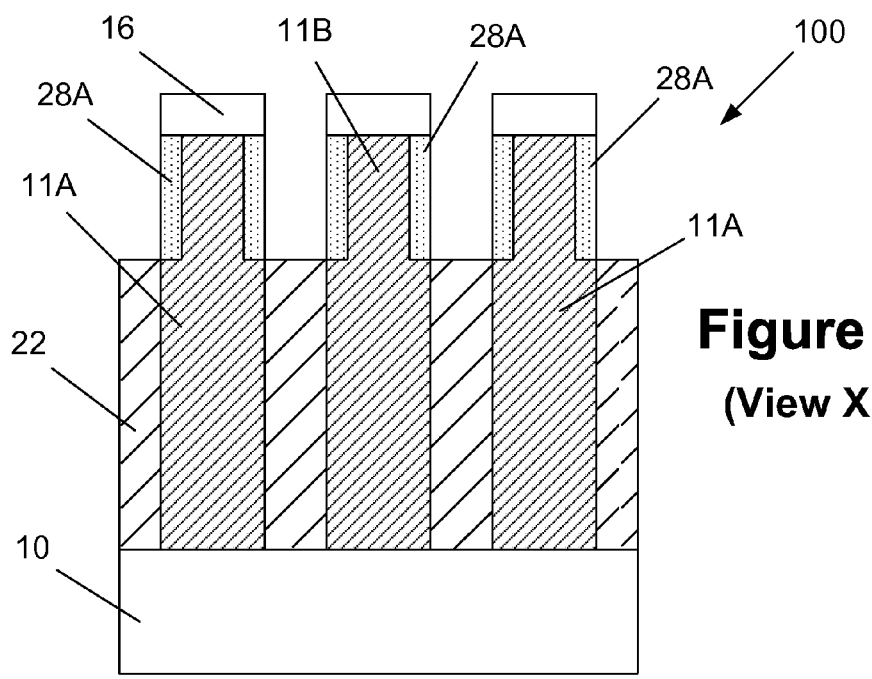
Figure 1I:
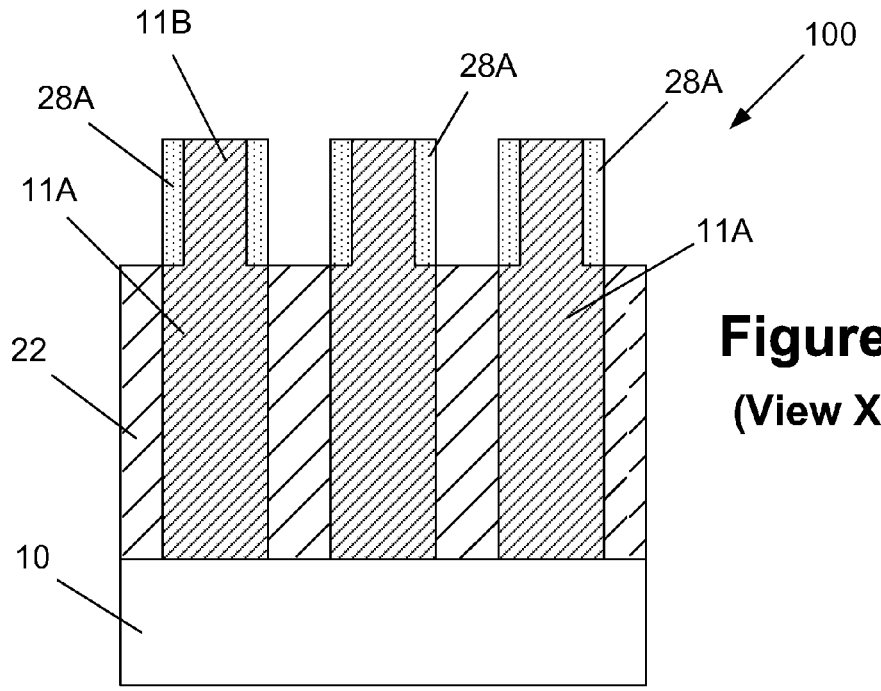
Figure 1J:
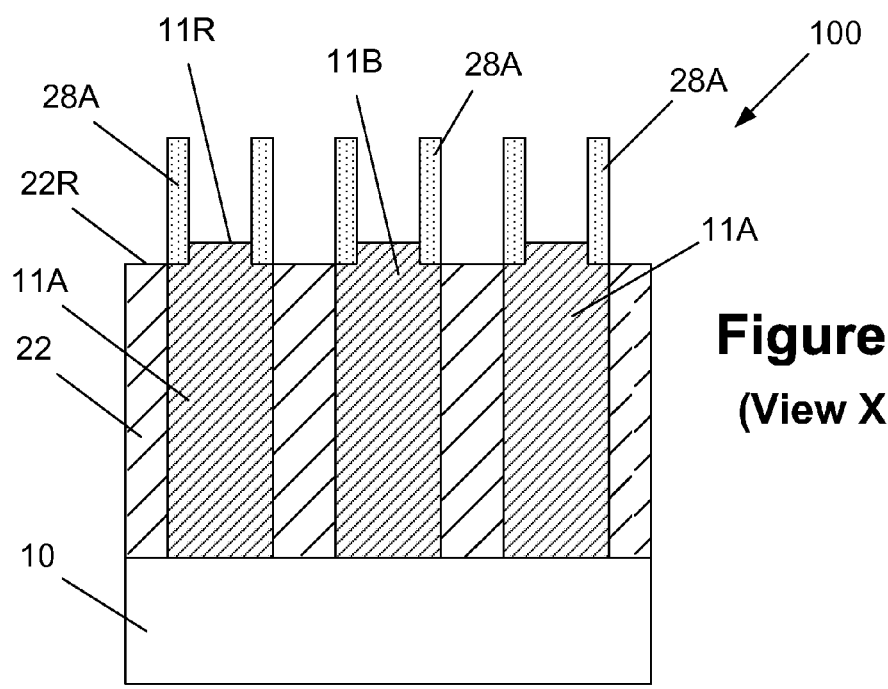

Next, as shown in FIG. 1H, an etching process, such as a timed wet or dry etching process, is performed to remove portions of the reduced thickness fin mandrel structures 11B relative to the semiconductor material spacers/fins 28A. As depicted, in some embodiments, the etching process is performed for such a duration that less than the entirety of the reduced thickness fin mandrel structures 11B is removed, e.g., the surface 11R of the reduced thickness fin mandrel structures 11B after recessing may be positioned about 10-40 nm above the recessed surface 22R of the layer of insulating material 22.

Figure 1K:
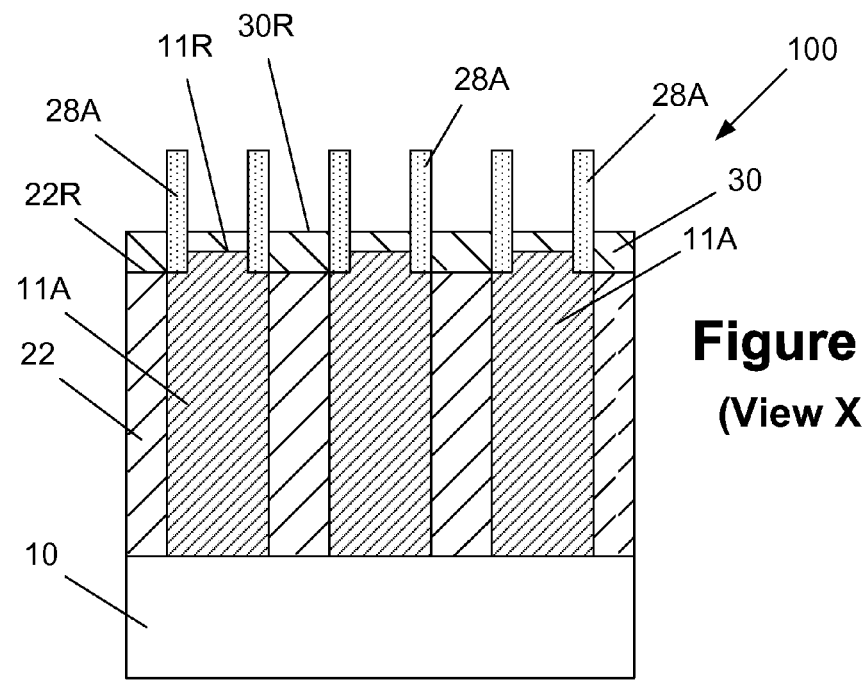

FIG. 1K depicts the device 100 after several process operations have been performed. First, a layer of insulating material 30 was formed on the device 100 so as to overfill the spaces or trenches between the semiconductor material spacers/fins 28A. The layer of insulating material 30 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc. Next, one or more chemical mechanical polishing (CMP) processes was performed to planarize the upper surface of the layer of insulating material 30 using the semiconductor material spacers/fins 28A as a polish-stop layer. After such a CMP process, the upper surface of the layer of insulating material 30 is substantially level with the upper surface of the semiconductor material spacers/fins 28A. With continuing reference to FIG. 1K, an etching process was then performed on the planarized layer of insulating material 30 to reduce its thickness and thereby result in the layer of insulating material 30 having a recessed surface 30R. The recessed surface 30R of the layer of insulating material 30 effectively defines the final height of the fins 28A, which may vary depending upon the particular application and, in one illustrative embodiment, may range from about 30-50 nm.

Figure 1L:
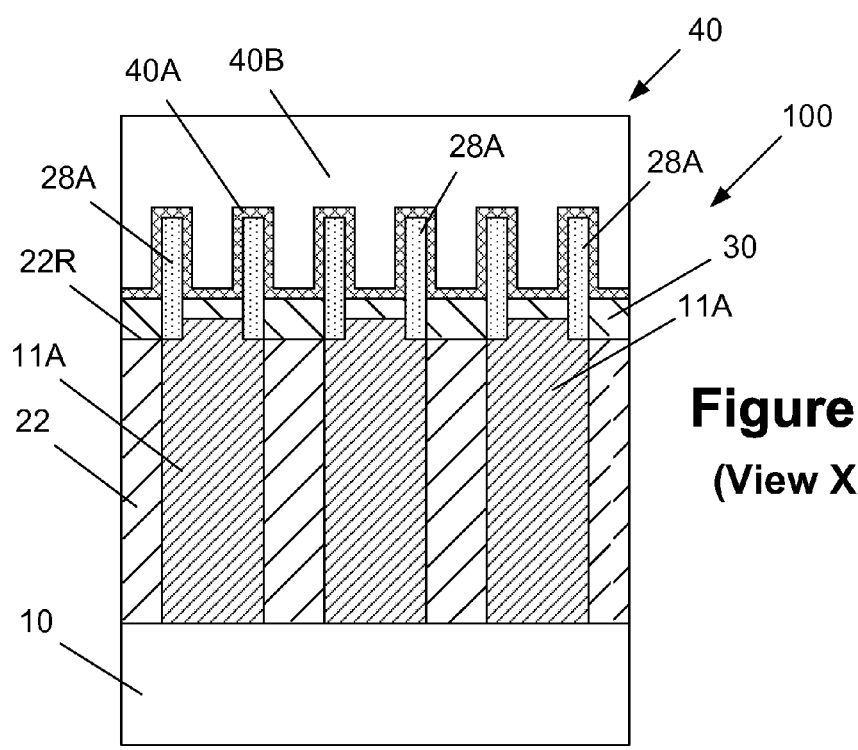

Next, as shown in FIG. 1L, a final gate structure 40 is formed on the device 100 using well-known techniques. i.e., gate-first or gate-last techniques. In one illustrative embodiment employing a gate-first manufacturing technique, the schematically depicted gate structure 40 includes an illustrative gate insulation layer 40A and an illustrative gate electrode 40B. An illustrative gate cap layer (not shown) may also be formed above the illustrative gate electrode 40B. The gate insulation layer 40A may be comprised of a variety of different materials, such as, for example, silicon dioxide, a so-called high-k (k greater than 7) insulation material (where k is the relative dielectric constant), etc. The thickness of the gate insulation layer 40A may also vary depending upon the particular application, e.g., it may have a physical thickness of about 1-2 nm. Similarly, the gate electrode 40B may also be of a variety of conductive materials, such as polysilicon or amorphous silicon, or it may be comprised of one or more metal layers that act as the gate electrode 40B. As will be recognized by those skilled in the art after a complete reading of the present application, the gate structure 40 of the device 100 depicted in the drawings, i.e., the gate insulation layer 40A and the gate electrode 40B, is intended to be representative in nature. That is, the gate structure 40 may be comprised of a variety of different materials and it may have a variety of configurations. In one illustrative embodiment, a thermal oxidation process may be performed to form a gate insulation layer 40A comprised of a semiconductor based oxide material, such as germanium oxide, silicon dioxide, a high-k layer of insulating material, $Al_2O_3$, etc. Thereafter, the gate electrode material 40B and the gate cap layer material (not shown) may be deposited above the device 100 and the layers may be patterned using known photolithographic and etching techniques. In another illustrative embodiment, a conformal CVD or ALD process may be performed to form a gate insulation layer 40A comprised of hafnium oxide. Thereafter, one or more metal layers (that will become the gate electrode 40B) and a gate cap layer material (not shown), e.g., silicon nitride, may be deposited above the device 100.

At this point, traditional manufacturing techniques may be performed to complete the manufacture of the device 100. For example, a sidewall spacer (not shown) comprised of, for example, silicon nitride, may be formed adjacent the final gate structure 40. After the spacer is formed, if desired, an epitaxial growth process may be performed to form additional semiconducting material (not shown) on the portions of the fins 28A positioned outside of the spacer. Additional contacts and metallization layers may then be formed above the device using traditional techniques.

As will be appreciated by those skilled in the art after a complete reading of the present application, the methods disclosed herein are broadly directed to various methods of forming fins for a FinFET device by oxidizing the sidewalls of a mandrel structure, removing the oxidized potions of the mandrel structure to thereby define a reduced thickness mandrel structure, forming a plurality of fins on the reduced thickness mandrel structure and performing an etching process to selectively remove at least a portion of the reduced thickness mandrel structure so as to thereby expose at least a portion of each of the fins. In the depicted example, the mandrel structure is a fin-shaped mandrel structure 11A that is formed by forming a plurality of trenches in a semiconductor material, but the presently disclosed inventions should not be considered as being limited to the illustrative examples depicted herein. That is, the mandrel structure may be formed in or above a semiconductor substrate and it need not have the illustrative fin-shaped structure depicted herein. For example, in one embodiment, the mandrel may be formed directly in the substrate and the formation of the additional layer of semiconductor material, i.e., the layer 11, may be omitted. The mandrel structures formed in the substrate may then be processed as described above, i.e., oxidation of the sidewall of the fin mandrel, removing the oxidized regions to define a reduced thickness mandrel, growth of a semiconductor material on the sidewalls of the reduced thickness mandrel, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a device, comprising:
    forming a mandrel structure having sidewalls;
    performing an oxidation process to oxidize at least a portion of said mandrel structure to thereby define oxidized regions on said sidewalls of said mandrel structure;
    removing said oxidized regions to thereby define a reduced thickness mandrel structure;
    forming a plurality of fins on said reduced thickness mandrel structure; and
    performing an etching process to selectively remove at least a portion of said reduced thickness mandrel structure so as to thereby expose at least a portion of each of said fins.

2. The method of claim 1, further comprising forming a final gate structure around at least a portion of said exposed portions of said fins.

3. The method of claim 1, wherein forming said mandrel structure comprises forming a fin-shaped mandrel structure by etching a plurality of trenches in a semiconductor material.

4. The method of claim 1, wherein said mandrel structure is formed above a semiconductor substrate comprised of silicon, germanium or silicon germanium.

5. The method of claim 4, wherein said fins are comprised of one of a III-V material, InGaAs, GaAs, InAs, or InSbAs.

6. The method of claim 1, wherein said mandrel structure and said fins are comprised of different semiconductor materials.

7. The method of claim 1, wherein said mandrel structure is formed in a semiconductor substrate comprised of silicon, germanium or silicon germanium.

8. The method of claim 1, wherein forming said plurality of fins on said reduced thickness mandrel structure comprises:
    forming an epitaxially grown semiconductor material on said reduced thickness mandrel structure; and
    performing an anisotropic etching process on said epitaxially grown semiconductor material to thereby define said plurality of fins comprised of said epitaxially grown semiconductor material on said reduced thickness mandrel structure.

9. The method of claim 1, wherein said sidewalls are substantially vertically oriented sidewalls.

10. A method of forming a device, comprising:
    forming a patterned mask layer above a first semiconductor material;
    performing at least one first etching process through said patterned mask layer to form a mandrel structure comprised of said first semiconductor material, said mandrel structure having sidewalls;
    performing an oxidation process to oxidize at least a portion of said mandrel structure to thereby define oxidized regions on said sidewalls of said mandrel structure;
    performing at least one second etching process to remove said oxidized regions to thereby define a reduced thickness mandrel structure;
    forming a second semiconductor material on said reduced thickness mandrel structure, said second semiconductor material being different than said first semiconductor material;
    performing at least one third etching process through said patterned mask layer to remove portions of said second semiconductor material so as to thereby define a plurality of fins comprised of said second semiconductor material on said reduced thickness mandrel structure; and
    performing at least one fourth etching process to selectively remove at least a portion of said reduced thickness mandrel structure so as to thereby expose at least a portion of each of said fins.

11. The method of claim 10, wherein, after performing said at least one third etching process, said plurality of fins are positioned under portions of said patterned mask layer.

12. A method of forming a device, comprising:
   forming a fin mandrel structure above a semiconductor substrate;
   performing an oxidation process to oxidize at least a portion of said fin mandrel structure to thereby define oxidized regions on said fin mandrel structure;
   removing said oxidized regions to thereby define a reduced thickness fin mandrel structure;
   forming a plurality of fins on said reduced thickness fin mandrel structure; and
   performing an etching process to selectively remove at least a portion of said reduced thickness fin mandrel structure so as to thereby expose at least a portion of each of said fins.

13. The method of claim 12, further comprising forming a final gate structure around at least a portion of said exposed portions of said fins.

14. The method of claim 12, wherein said semiconductor substrate is comprised of silicon and said fin mandrel structure is comprised of one of silicon, germanium, or a silicon germanium compound and said fins are comprised of one of a III-V material, InGaAs, GaAs, InAs, or InSbAs.

15. The method of claim 13, wherein said final gate structure comprises a gate insulation layer comprised of a high-k insulating material and a gate electrode comprised of at least one layer of metal.

16. The method of claim 13, wherein said final gate structure comprises a gate insulation layer comprised of an oxide and a gate electrode comprised of polysilicon.

17. The method of claim 12, wherein forming said fin mandrel structure comprises:
   forming a first layer of a first semiconductor material above said semiconductor substrate;
   forming a patterned masking layer above said first layer of said first semiconductor material; and
   performing at least one first etching process through said patterned masking layer to thereby form a plurality of spaced-apart trenches in said first layer of said first semiconductor material to thereby define said fin mandrel structure comprised of said first semiconductor material.

18. The method of claim 17, wherein said substrate is comprised of a second semiconductor material that is different than said first semiconductor material.

19. The method of claim 12, wherein removing said oxidized regions comprises performing a wet etching process or a dry etching process to remove said oxidized regions.

20. The method of claim 12, wherein forming said plurality of fins on said reduced thickness fin mandrel structure comprises;
   forming an epitaxially grown semiconductor material on said reduced thickness fin mandrel structure; and
   performing an anisotropic etching process through a patterned mask layer on said epitaxially grown semiconductor material to thereby define said plurality of fins comprised of said epitaxially grown semiconductor material on said reduced thickness fin mandrel structure.

21. The method of claim 12, wherein performing said etching process to selectively remove at least a portion of said reduced thickness fin mandrel structure so as to thereby expose at least a portion of each of said fins comprises performing a timed etching process.

22. A method of forming a device, comprising:
   forming a fin mandrel structure comprised of a first semiconductor material above a semiconductor substrate comprised of a second semiconductor material that is different than said first semiconductor material;
   performing an oxidation process to oxidize at least a portion of said fin mandrel structure to thereby define oxidized semiconductor material regions on said fin mandrel structure;
   removing said oxidized semiconductor material regions to thereby define a reduced thickness fin mandrel structure;
   forming a plurality of fins on said reduced thickness fin mandrel structure, said fins being comprised of an epitaxially grown semiconductor material;
   performing an etching process to selectively remove at least a portion of said reduced thickness fin mandrel structure so as to thereby expose at least a portion of each of said fins; and
   forming a final gate structure around at least a portion of said exposed portions of said fins.

23. The method of claim 22, wherein said semiconductor substrate is comprised of silicon and said fin mandrel structure is comprised of one of silicon, germanium or a silicon germanium compound and said fins are comprised of one of a III-V material, InGaAs, GaAs, InAs or InSbAs.

24. The method of claim 22, wherein said epitaxially grown semiconductor material is a different semiconductor material that that of said first and second semiconductor materials.

25. The method of claim 22, wherein forming said fin mandrel structure comprises:
   forming a first layer of said first semiconductor material above said semiconductor substrate;
   forming a patterned masking layer above said first layer of said first semiconductor material; and
   performing at least one first etching process through said patterned masking layer to thereby form a plurality of spaced-apart trenches in said first layer of said first semiconductor material to thereby define said fin mandrel structure comprised of said first semiconductor material.

26. The method of claim 22, wherein removing said oxidized semiconductor material regions comprise performing a wet etching process or a dry etching process to remove said oxidized semiconductor material regions.

27. The method of claim 22, wherein forming said plurality of fins on said reduced thickness fin mandrel structure comprises;
   forming said epitaxially grown semiconductor material on said reduced thickness fin mandrel structure; and
   performing an anisotropic etching process through a patterned mask layer on said epitaxially grown semiconductor material to thereby define said plurality of fins comprised of said epitaxially grown semiconductor material on said reduced thickness fin mandrel structure.

28. The method of claim 22, wherein performing said etching process to selectively remove at least a portion of said reduced thickness fin mandrel structure so as to thereby expose at least a portion of each of said fins comprises performing a timed etching process.

29. A method of forming a device, comprising:
   forming a first layer of a first semiconductor material above a semiconductor substrate comprised of a second semiconducting material that is different than said first semiconductor material;
   forming a patterned masking layer above said first layer of said first semiconductor material;
   performing at least one first etching process through said patterned masking layer to thereby form a plurality of spaced-apart trenches in said layer of said first semiconductor material to thereby define a fin mandrel structure comprised of said first semiconductor material;

forming a layer of insulating material above said substrate and in said spaced-apart trenches, said layer of insulating material having an upper surface that exposes a portion of said fin mandrel structure;

performing an oxidation process to oxidize said exposed portion of said fin mandrel structure to thereby define oxidized semiconductor material regions on said fin mandrel structure;

removing said oxidized semiconductor material regions to thereby define a reduced thickness fin mandrel structure;

forming an epitaxially grown semiconductor material on said reduced thickness fin mandrel structure in the presence of said patterned mask layer;

performing an anisotropic etching process through said patterned masking layer on said epitaxially grown semiconductor material to thereby define a plurality of fins comprised of said epitaxially grown semiconductor material on said reduced thickness fin mandrel structure;

removing said patterned masking layer;

performing an etching process to selectively remove at least a portion of said reduced thickness fin mandrel structure so as to thereby expose at least a portion of each of said fins; and forming a final gate structure around at least a portion of said exposed portions of said fins.

30. The method of claim 29, wherein said first semiconductor material is comprised of silicon germanium, said second semiconductor material is comprised of silicon and said epitaxially grown semiconductor material is comprised of one of a III-V material InGaAs, GaAs, InAs or InSbAs.

31. The method of claim 29, wherein said epitaxially grown semiconductor material is a different semiconductor material that that of said first and second semiconductor materials.

32. The method of claim 29, wherein said patterned mask layer is comprised of silicon nitride.

33. A method of forming a device, comprising:
forming a plurality of spaced-apart trenches in a substrate comprised of a semiconductor material to thereby define a mandrel structure comprised of said semiconductor material;

performing an oxidation process to oxidize at least a portion of said mandrel structure to thereby define oxidized regions on said mandrel structure;

removing said oxidized regions to thereby define a reduced thickness mandrel structure;

forming a plurality of fins on said reduced thickness mandrel structure; and performing an etching process to selectively remove at least a portion of said reduced thickness mandrel structure so as to thereby expose at least a portion of each of said fins.

34. The method of claim 33, wherein forming said mandrel structure comprises:
forming a patterned masking layer above said substrate; and
performing at least one first etching process through said patterned masking layer to thereby form said plurality of spaced-apart trenches.

35. The method of claim 33, wherein forming said plurality of fins on said reduced thickness mandrel structure comprises;
forming an epitaxially grown semiconductor material on said reduced thickness mandrel structure; and
performing an anisotropic etching process through a patterned mask layer on said epitaxially grown semiconductor material to thereby define said plurality of fins comprised of said epitaxially grown semiconductor material on said reduced thickness mandrel structure.

36. The method of claim 33, wherein performing said etching process to selectively remove at least a portion of said reduced thickness mandrel structure so as to thereby expose at least a portion of each of said fins comprises performing a timed etching process.

37. The method of claim 33, wherein said mandrel structure is a fin-shaped mandrel structure.

38. A method of forming a device, comprising:
forming a patterned mask layer above a substrate comprised of a first semiconductor material;

performing at least one first etching process to form a plurality of spaced-apart trenches in said substrate, said trenches defining a mandrel structure comprised of said first semiconductor material;

performing an oxidation process to oxidize at least a portion of said mandrel structure to thereby define oxidized regions on said mandrel structure;

performing at least one second etching process to remove said oxidized regions to thereby define a reduced thickness mandrel structure;

forming a second semiconductor material on said reduced thickness mandrel structure, said second semiconductor material being different than said first semiconductor material;

performing at least one third etching process through said patterned mask layer to remove portions of said second semiconductor material so as to thereby define a plurality of fins comprised of said second semiconductor material on said reduced thickness mandrel structure; and performing at least one fourth etching process to selectively remove at least a portion of said reduced thickness mandrel structure so as to thereby expose at least a portion of each of said fins.

39. The method of claim 38, wherein, after performing said at least one third etching process, said plurality of fins are positioned under portions of said patterned mask layer.

* * * * *